United States Patent
Vashchenko et al.

(10) Patent No.: US 6,853,053 B1
(45) Date of Patent: Feb. 8, 2005

(54) BJT BASED ESD PROTECTION STRUCTURE WITH IMPROVED CURRENT STABILITY

(75) Inventors: Vladislav Vashchenko, Palo Alto, CA (US); Ann Concannon, San Jose, CA (US); Peter J. Hopper, San Jose, CA (US); Marcel ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/436,560

(22) Filed: May 12, 2003

(51) Int. Cl.[7] .............................................. H01L 31/11
(52) U.S. Cl. ........................ 257/565; 257/565; 257/579
(58) Field of Search ................................ 257/565, 579, 257/360, 369, 591, 546, 363, 361

(56) References Cited

U.S. PATENT DOCUMENTS

| | | | | |
|---|---|---|---|---|
| 5,426,323 A | * | 6/1995 | Reczek et al. | 257/360 |
| 2002/0135046 A1 | * | 9/2002 | Yu | 257/579 |
| 2003/0085429 A1 | * | 5/2003 | Hulfachor | 257/369 |

* cited by examiner

*Primary Examiner*—David Nelms
*Assistant Examiner*—Thinh T Nguyen
(74) *Attorney, Agent, or Firm*—Jurgen Vollrath

(57) ABSTRACT

In a BJT ESD protection structure, the ESD current density is stabilized by partially blocking one or more of the emitter and n+ collector, sinker, and n-buried layer to define a comb-like structure for the partially blocked regions.

2 Claims, 3 Drawing Sheets

BJT BASED ESD PROTECTION STRUCTURE WITH IMPROVED CURRENT STABILITY

FIELD OF THE INVENTION

The invention relates to BJT based ESD protection devices. In particular it relates to an ESD protection structure in which some of the regions are partially blocked to improve current stability.

BACKGROUND OF THE INVENTION

Integrated circuit devices typically display sensitivity to electrostatic discharge (ESD) events thus making it necessary to take measures to protect these circuits. I/O circuits may either be protected by providing separate ESD protection structures or, preferably, providing for ESD self-protection of the I/O drivers. One common way of protecting BiCMOS circuits is through the use of BJT devices. However, a critical consideration for a triggering structure, whether it be a BJT or GGNMOS or any other triggering structure, is the anode current distribution near the junction breakdown region. In the case of GGNMOS, one approach adopted to improve current spreading is to make use of a so-called ballasting region that serves as a saturation resistor. The ballast region of a GGNMOS typically comprises an extended, unsilicided, drain region. This has the effect of not only limiting the total current but also provides for local current density stabilization.

However, as the dimensions of structures continues to be reduced, the resistance provided by the ballasting region is also reduced. Furthermore, there is a need not to add costs by having to introduce additional process steps. One solution for addressing this issue in the case of GGNMOS is presented in a previously filed application owned by the same assignee as the present invention, which makes use of a partially blocked ballasting region to provide a comb-like ballasting region.

The present invention provides for current stabilization in the case of BJT devices.

SUMMARY OF THE INVENTION

The present invention provides a BJT based ESD protection structure in which one or more regions of the collector are partially blocked. Thus the present invention defines a comb-like structure for one or more of the n-sinker and n-buried layer (NBL). The emitter may also be partially blocked.

DETAILED DESCRIPTION OF THE INVENTION

Figure 1:
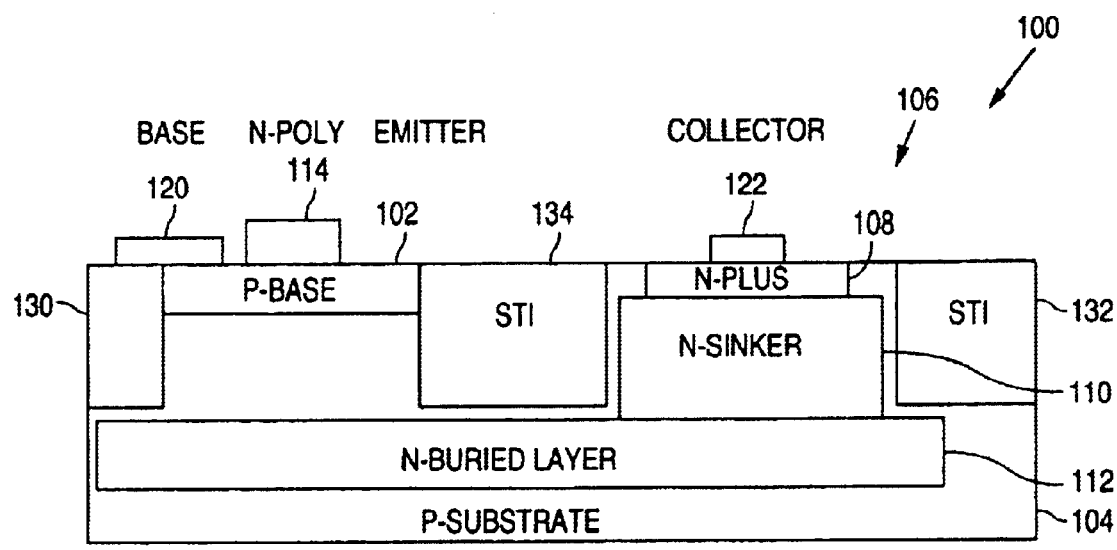
FIG. 1 shows a cross section through a typical prior art BJT structure.
Figure 2:
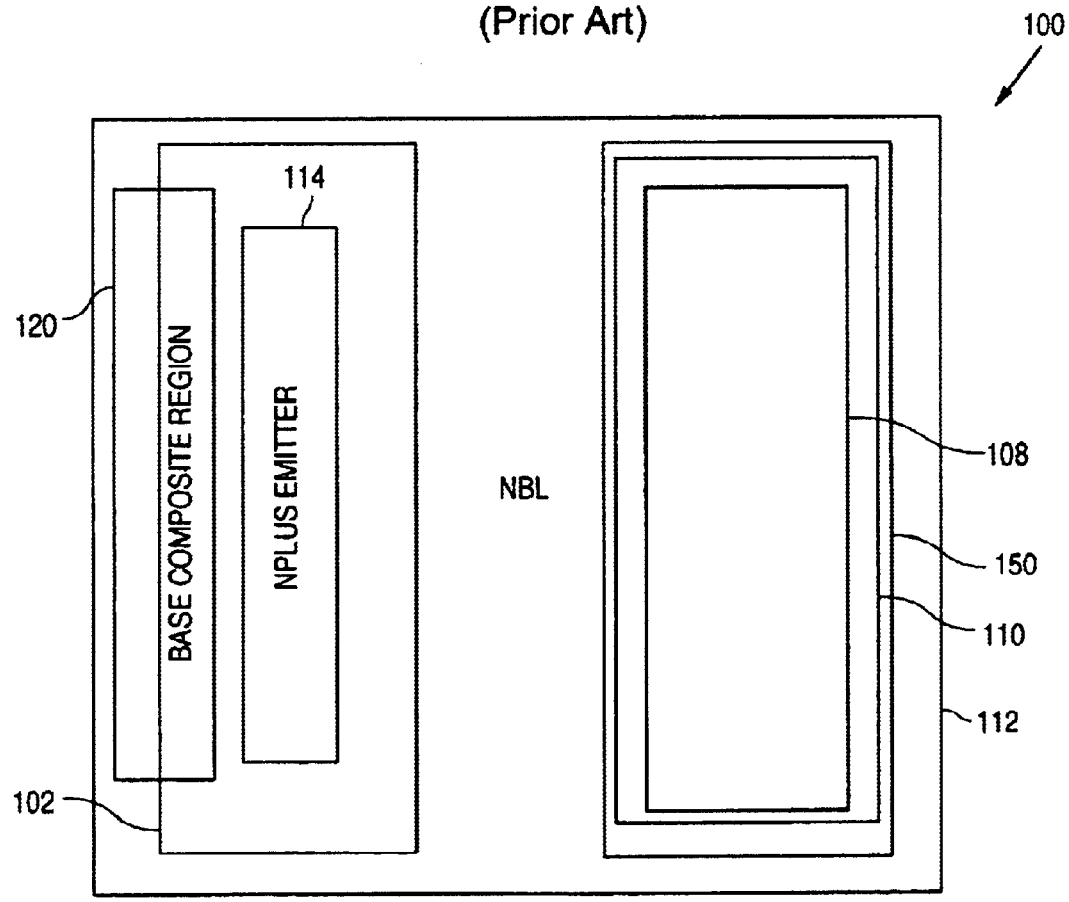
FIG. 2 shows a plan view of part of the structure of FIG. 1.

FIGS. 1 and 2 show a typical BJT structure. In FIG. 1, the npn BJT 100 is shown in cross-section to show the abase 102 formed in a p-substrate 104. The collector 106, comprising n+ region 108, n– sinker 110, and n-buried layer (NBL) 112, are also formed in the p-substrate 104. The BJT 100, further, includes an emitter 114 in the form of a polysilicon region. FIG. 1 also shows a base contact 120 and a collector contact 122 (contact 122 is not shown in FIG. 2). Shallow trench isolation (STI) regions 130, 132 isolate the device from other devices and STI 134 separates the collector 106 from the emitter 114 to limit junction breakdown. FIG. 2 also shows the perimeter 150 of the opening in the STI. It will be appreciated that process variations may result in slight structural variations in defining the emitter, base and collector regions.

As mentioned above, the typical prior art structure, such as the one described with reference to FIGS. 1 and 2, does not always provide optimal resistance during ESD events. This becomes particularly problematic as structural dimensions continue to be reduced, thereby further reducing resistance levels. The present invention seeks to address this problem by providing increased total resistance and improved current spreading. Furthermore, it does so without introducing additional process steps.

Figure 3:
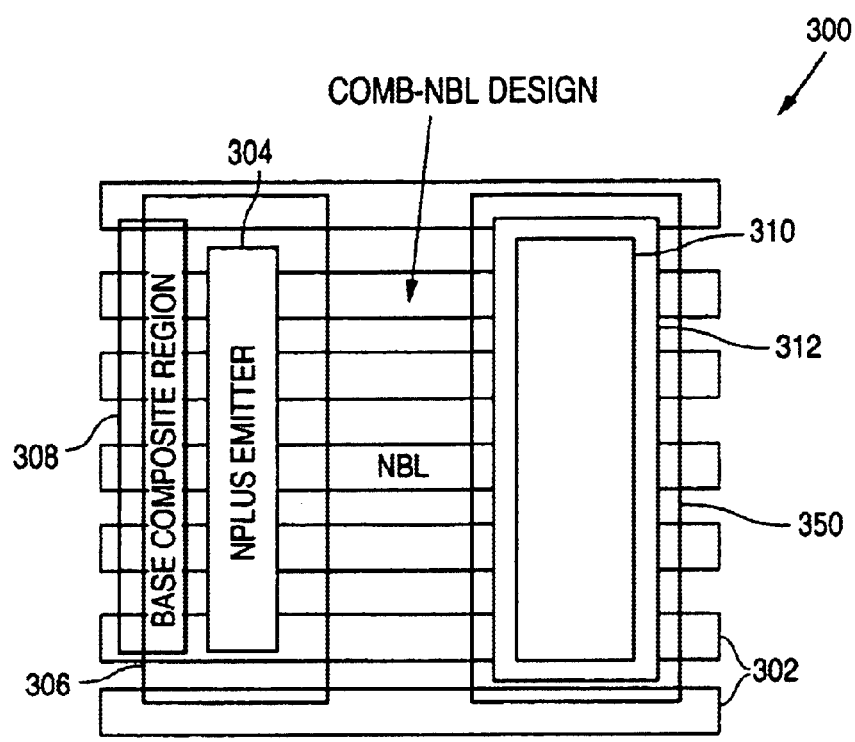
FIG. 3 shows a plan view of one embodiment of a BJT structure of the invention.

FIG. 3 shows a plan view of one embodiment of a BJT structure of the present invention. The BJT 300 includes a comb-like NBL 302 used as part of the collector of the BIT structure to define a vertical arrangement for the emitter 304, base 306, and collector. (The base contact is depicted by reference numeral 308). The collector, further, includes a n+ region (310), and a sinker region 312, which connects the n+ region 310 to the NBL 302. (The perimeter of the opening in the STI is given by reference numeral 350) The comb-like NBL 302 is formed by partially blocking the NBL during its formation. By providing a comb-like structure, the present BJT provides reduced overall current and improved current distribution for improved current density stabilization.

Figure 4:
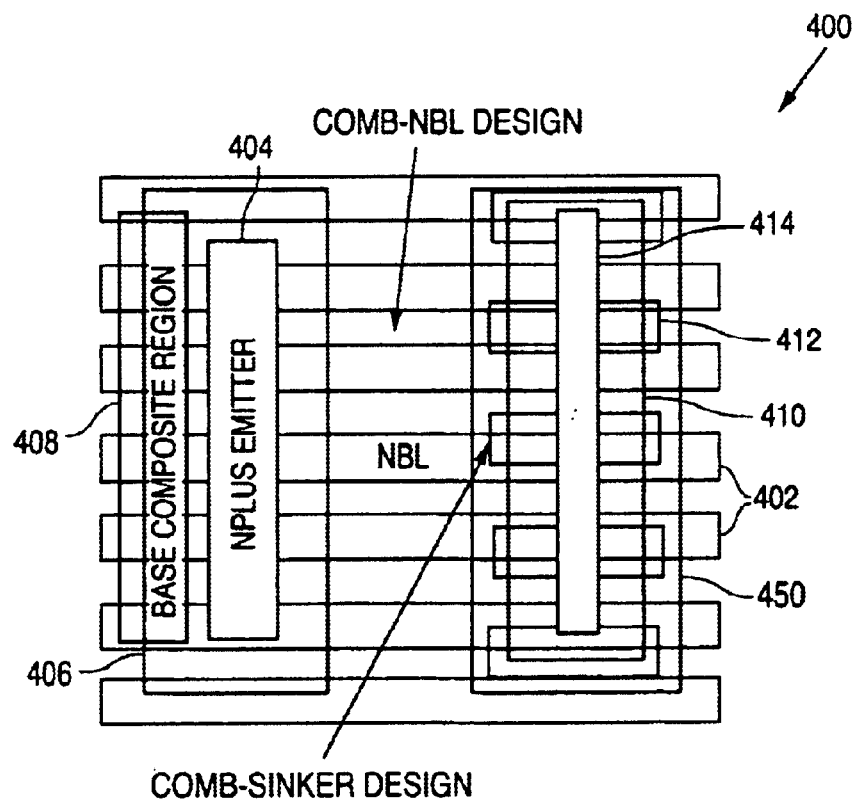
FIG. 4 shows a plan view of another embodiment of a BJT structure of the invention.

Another embodiment of a BJT device of the invention is shown in FIG. 4. In the device 400, not only the NBL 402 is partially blocked, but also the sinker 412 of the collector is partially blocked to define a comb-like n+ region. The n+ region 410 of the collector is not blocked in this embodiment, thereby providing a heavily doped region for the collector contact. The device also includes a n+ emitter 404 and base 406 (with base contact 408). This embodiment also shows the collector contact 414. (The perimeter of the opening in the STI is given by reference numeral 450).

Figure 5:
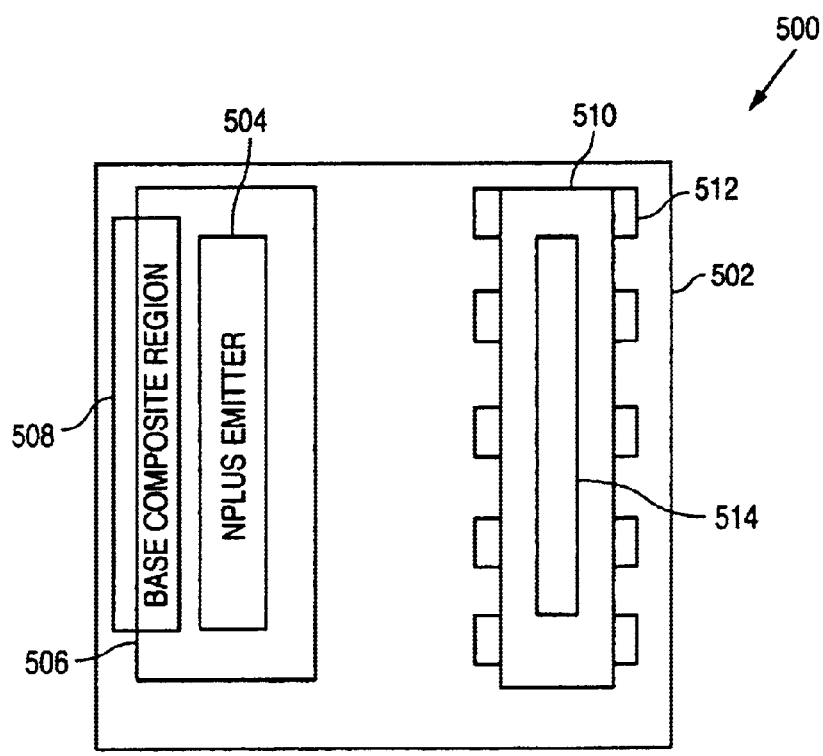
FIG. 5 shows a plan view of yet another embodiment of a BJT structure of the invention.

FIG. 5 shows yet another embodiment of the invention. The BJT 500 in this embodiment includes a partially blocked sinker 512 to define a comb-like sinker. The device 500 also includes a n+ emitter 504, base 506 (with base contact 508), and collector n+ region 510 with collector contact 514. In this embodiment, the n+ region 510 and NBL 502 are not blocked. It will, however, be appreciated that any one or more of the n+ region of the collector, the sinker, and the NBL can be partially blocked in accordance with the invention.

Figure 6:
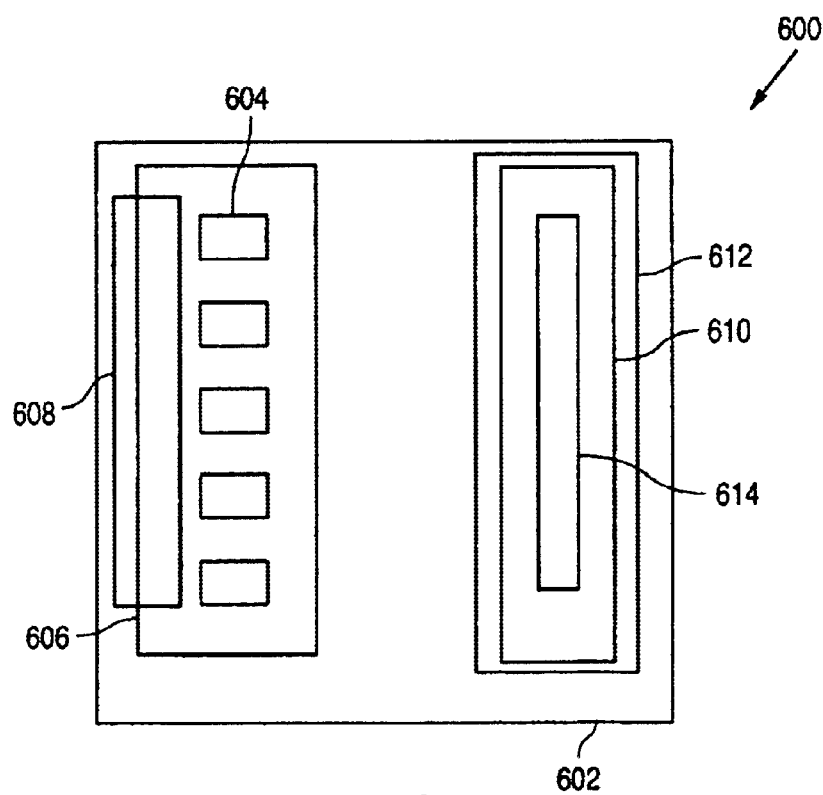
FIG. 6 shows a plan view of yet another embodiment of a BJT structure of the invention.

The invention also contemplates partially blocking the n+ emitter as shown in FIG. 6. FIG. 6 shows a NPN BJT 600 shows a partially blocked emitter poly 604 to define a comb-like emitter or a plurality of emitter islands. The BJT 600, further, includes a base 606 (with base contact 608), a n+ region 610 for the collector (with collector contact 614), a sinker 612, and a NBL 602. (For simplicity, in both the FIGS. 5 and 6 embodiments, the perimeter of the opening in the STI is not shown.)

Again, it will be appreciated that the comb-like emitter of FIG. 6 could be combined with comb-like configurations of one or more of the collector n+ region, sinker, and NBL. Furthermore, by manipulating the relative degree to which any of the regions discussed, is blocked, different amounts of resistance can be achieved. Thus by varying the amount of blocking and distance between blocked regions, the desired configuration can be determined using simulation techniques.

It will be appreciated that only specific embodiments of BJT structures were discussed but that different embodiments can be devised without departing from the scope of the invention.

What is claimed is:

1. A BJT, comprising a collector that includes a n+ region, a sinker, and a n-buried layer;

an emitter, and a base, wherein at least one of the n+ region, sinker, and n-buried layer is partially blocked to define a comb-like structure.

2. A method of forming a BJT, comprising providing a n-buried layer in a p-material, providing p-base in the p-material, providing an emitter, providing a sinker, and providing a n+ collector region, wherein one or more of providing a n-buried layer, sinker, and n+ collector includes partially blocking said one or more regions.

* * * * *